United States Patent [19]

Splittgerber et al.

[11] 4,261,770
[45] Apr. 14, 1981

[54] PROCESS FOR PRODUCING EPITAXIAL SEMICONDUCTOR MATERIAL LAYERS ON MONOCRYSTALLINE SUBSTRATES VIA LIQUID PHASE SHIFT EPITAXY

[75] Inventors: Heinz Splittgerber, Munich; Karl-Heinz Zschauer, Grafing; Wolfgang Endler, Zorneding, all of Fed. Rep. of Germany

[73] Assignee: Siemens Aktiengesellschaft, Berlin & Munich, Fed. Rep. of Germany

[21] Appl. No.: 130,161

[22] Filed: Mar. 13, 1980

[30] Foreign Application Priority Data

Mar. 19, 1979 [DE] Fed. Rep. of Germany ....... 2910723

[51] Int. Cl.³ .......................................... H01L 21/208
[52] U.S. Cl. ................................... 148/171; 148/172; 148/173; 118/415
[58] Field of Search ........................ 148/171, 172, 173; 118/415

[56] References Cited

U.S. PATENT DOCUMENTS

| 3,901,744 | 8/1975 | Bolger et al. | 148/171 |
| 4,050,964 | 9/1977 | Rode | 148/172 |
| 4,088,514 | 5/1978 | Hara | 148/171 |
| 4,115,162 | 9/1978 | Pawlik et al. | 148/171 |

FOREIGN PATENT DOCUMENTS 2404017 8/1974 Fed. Rep. of Germany .
2641347 3/1978 Fed. Rep. of Germany .
1526898 11/1978

OTHER PUBLICATIONS

Rode, *Western Electric Technical Digest*, No. 46, p. 29 (Apr. 1977).
Rode et al., *J. of Crystal Growth*, vol. 29, pp. 61–64 (1975).

*Primary Examiner*—G. Ozaki
*Attorney, Agent, or Firm*—Hill, Van Santen, Steadman, Chiara & Simpson

[57] ABSTRACT

A process for producing epitaxial semiconductor material layers on monocrystalline substrates via liquid phase shift epitaxy wherein, in order to avoid bead-growth on a substrate, at least the lower region of an epitaxy solution chamber is clad with a substrate material so as to displace the location of the bead growth away from the actual substrate and toward the region of the cladding. This process is useful for producing GaAs-(Ga, Al) As and (Ga, In) (As, P) mixed crystal layers for luminescent diodes and laser diodes.

4 Claims, 1 Drawing Figure

U.S. Patent   Apr. 14, 1981   4,261,770
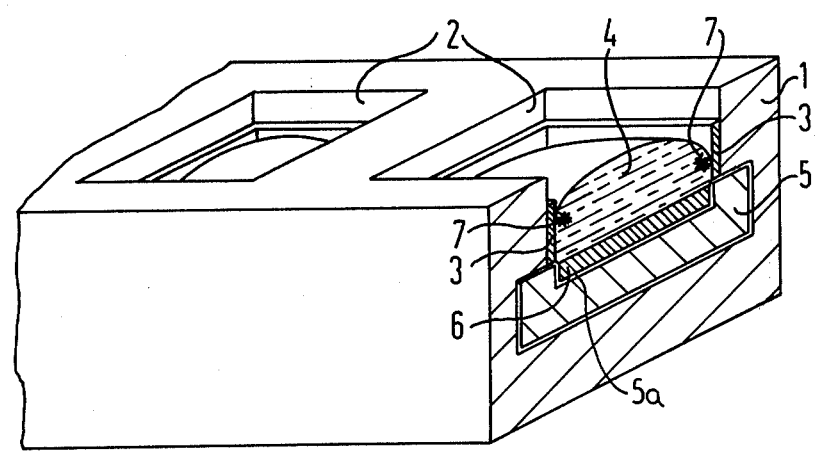

PROCESS FOR PRODUCING EPITAXIAL SEMICONDUCTOR MATERIAL LAYERS ON MONOCRYSTALLINE SUBSTRATES VIA LIQUID PHASE SHIFT EPITAXY

BACKGROUND OF THE INVENTION

1. Field of the Invention:

The invention relates to epitaxial layers of semiconductor materials and somewhat more particularly to a method and apparatus for producing expitaxial layers via liquid phase shift epitaxy.

2. Prior Art:

Processes for producing epitaxial layers of semiconductor material, such as composed of $A_{III}B_V$-compounds, on monocrystalline substrates via liquid phase shift epitaxy are known wherein a surface of a substrate is contacted with a solution of such compounds and out of which, as a result of oversaturation, an epitaxial layer is deposited on the substrate surface and the solution is then removed from the substrate and the overlying epitaxial layer.

For example, German Offenlegungsschrift No. 26 41 347 describes a liquid phase shift epitaxy process of this type and a device for practicing such process.

Normally, the liquid phase shift epitaxy process involves a strong growth at the edges of the epitaxial layer, which is generally referred to as "bead-growth". However, when a plurality of layer sequences are produced in one operation, certain disadvantages occur because of such bead-growth. One disadvantage is that residues of a removed solution remain suspended on the beads and during the next application of a solution, which can be different from the first removed solution, are drawn into such subsequent solution and contaminate it. Another disadvantage is that portions of the beads break-off when the solution chamber is passed over the newly deposited epitaxial layer and thus mechanically damage such epitaxial layer.

These disadvantages make it nearly impossible to produce quality semiconductor components, such as for laser diodes. A further disadvantage resulting from the presence of beads is that instances when the substrate and overlying epitaxial layer are further processed via planar techniques, a lack of definition occurs during focusing in the photographic process.

A plurality of methods for avoiding bead-growth at the edges of a deposited epitaxial layer or substrate are known. For example, German Offenlegungsschrift 24 04 017 describes a process wherein, prior to the epitaxial process, the edge zones of the substrate are covered with a masking layer composed of a heat-resistant material (silicon dioxide or silicon nitride).

Western Electric Technical Digest, No. 46, page 77 describes another means of avoiding bead-growth whereby the chambers containing the melt solution are additionally heated by heating coils positioned thereabout in order to minimize and/or eliminate heat discharge through the graphite chamber walls.

The *Journal Cryst. Growth*, Vol. 29, (1975), pages 62–64 describes yet another means of avoiding bead-growth whereby a so-called step-cooling process is used during the epitaxial deposition.

Finally, the earlier mentioned German Offenlegungsschrift No. 26 41 347 suggests that bead formation at the substrate edges can be avoided by modifying the spatial orientation of the substrate edges, based on the fact that the speed of crystal growth at edges is dependent upon the spatial orientation of such edges. In this process, substrates are selected which are split and sawn in such a manner that the boundary edges of the substrate surfaces are not edges at which rapid bead-growth typically occurs.

SUMMARY OF THE INVENTION

The invention provides an improved method and apparatus for suppressing bead-growth at the edges of an epitaxial layer or a substrate during liquid phase shift epitaxy.

In accordance with the principles of the invention, at least the lower regions of chambers containing the solution from which an epitaxial layer is to be deposited, are clad with a layer of a substrate material so that the location of the bead-growth is moved away from the actual substrate deposition surface and toward such cladding. In preferred embodiments of the invention, the side walls of the solution-receiving chamber in a liquid phase shift epitaxy device are clad with the same semiconductor material as forming the actual substrate. This principle effectively enlarges the substrate and displaces the location of beadgrowth toward the semiconductor material cladding on the side walls of the chamber. The invention is based on the recognition that bead-growth always occurs at the three-phase boundary defined between a solid semiconductor material, a melt solution and an external phase.

The principles of the invention are particularly useful in producing epitaxial gallium arsenide layers, gallium aluminium arsenide layers and/or (Ga, In) (As, P) mixed crystal layers for luminescent diodes and laser diodes.

BRIEF DESCRIPTION OF THE DRAWINGS

The single FIGURE is a partial, elevated prospective view, partially in cross-section, of a liquid phase shift apparatus constructed and operable in accordance with the principles of the invention.

DESCRIPTION OF THE PREFERRED EMBODIMENTS

For the purposes of promoting and understanding the principles of the invention, reference will now be made to an exemplary embodiment of the invention, which relates to production of epitaxial gallium arsenide layers with the aid of the device illustrated in the drawings. However, it will be understood that other epitaxial semiconductor material layers can also be produced from the invention, for example from $A_{III}B_V$-semiconductor compounds.

An operational liquid phase shift epitaxial device is comprised of a housing 1, for example composed of graphite and is provided with a plurality of solution-receiving chambers 2 within the housing 1. A carrier plate 5, for example composed of graphite, is positioned in a displaceable manner along the bottom of each chamber 2. Each plate 5 is provided with a recess 5a for receiving a substrate 6 therein for movement with each respective plate 5. In the embodiment here under discussion, substrate 6 is composed of a monocrystalline gallium arsenide wafer. A cladding 3 is provided along at least the lower regions of side walls of each chamber 2 so as to at least contact the carrier plate 5 and preferably the outer edge regions of substrate 6 and extend upwardly therefrom along such side walls. In the embodiment here under discussion, cladding 3 is composed of gallium arsenide. An operative device of this type includes means for periodically moving the carrier plate and substrate away from the interior of chamber 2 as well as means for maintaining a solution of a semiconductor material in each chamber 2. A saturated or slightly over-saturated solution 4 composed of, for example molten gallium as a solvent and an amount of molten arsenic equal to a few atomic % is provided within each chamber 2. The exact composition of solution 4 is determined in accordance with solubility diagrams and growth temperatures, based on relevant parameters of gallium arsenide and corresponding dopants. During operation, the graphite carrier plate 5 is periodically displaced within body 1 relative to chamber 2 and the substrate 6 positioned within recess 5a in plate 5 can also be displaced with the graphite plate. When the carrier plate 5 is displaced relative to the chamber 2, the variously doped gallium arsenide solution can consecutively contact the upper surface of substrate 6 and deposit corresponding epitaxial layers on such surface. An advantage of this type of operation is that between individual growth layers, the last-grown epitaxial layer is not exposed to atmosphere and thus cannot become oxidized.

The presence of the semiconductive material cladding 3, i.e., gallium arsenide, on the side walls of chamber 2 ensures that the strong edge growth, which occurs in known processes, is displaced away from substrate 6 and toward the cladding 3 on regions 7 thereof. In this manner, the so-produced epitaxial layers are extremely level, even in instances of multi-layer growth and with hetero-structures.

As is apparent from the foregoing specification, the present invention is susceptible of being embodied with various alterations and modifications which may differ particularly from those that have been described in the preceding specification and description. For this reason, it is to be fully understood that all of the foregoing is intended to be merely illustrative and is not to be construed or interpreted as being restrictive or otherwise limiting of the present invention, excepting as it is set forth and defined in the hereto-appended claims.

We claim as our invention:

1. In a process for producing epitaxial layers comprised of semiconductor materials selected from $A_{III}B_V$-compounds on a monocrystalline substrate in accordance with liquid phase shift epitaxy wherein an epitaxial layer is deposited on a surface of a substrate which is in contact with an over-saturated solution of said compound contained within a chamber and thereafter such solution is removed from the substrate and from the overlying epitaxial layer, the improvement comprising:
    cladding at least lower regions of said chamber with a substrate material so as to displace bead-growth locations away from the actual substrate surface and toward such cladding.

2. In a process as defined in claim 1 wherein side walls of said chamber containing the over-saturated solution of said compound are clad with a semiconductor material which is the same as that from which said substrate is composed.

3. Use of the process as defined in claim 1 for production of GaAs-(Ga, Al) As and (Ga, In) (As, P) mixed crystal layers for luminescent diodes and laser diodes.

4. A method of producing epitaxial layers composed of semiconductor materials selected from the group consisting of GaAs-(Ga, Al) As and (Ga, In) (As, P) comprising:
    providing a plurality of spaced-apart solution-receiving chambers in a housing, with each chamber having a carrier plate positioned in a displaceable manner along the bottom thereof, said carrier plate having a recess therein for receiving a substrate, said substrate being composed of said semiconductor material;
    providing a cladding at least along lower regions of said chamber said cladding being composed of said semiconductor material;
    providing a solution of said semiconductor material in said chamber; and
    periodically displacing said carrier plate and substrate relative to said chamber so that an epitaxial layer formed of said semiconductor material is deposited on said substrate.

* * * * *